(12) United States Patent
Hazanchuk et al.

(10) Patent No.: US 8,463,832 B1
(45) Date of Patent: Jun. 11, 2013

(54) DIGITAL SIGNAL PROCESSING BLOCK ARCHITECTURE FOR PROGRAMMABLE LOGIC DEVICE

(75) Inventors: Asher Hazanchuk, Sunnyvale, CA (US); Ian Ing, San Jose, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1386 days.

(21) Appl. No.: 12/146,042

(22) Filed: Jun. 25, 2008

(51) Int. Cl.
*G06F 7/38* (2006.01)
(52) U.S. Cl.
USPC .......................... 708/230; 708/490; 708/523
(58) Field of Classification Search
USPC ................. 708/230, 231, 236, 234, 490, 523
See application file for complete search history.

(56) References Cited

U.S. PATENT DOCUMENTS

| | | | | |
|---|---|---|---|---|
| 4,736,287 | A * | 4/1988 | Druke et al. ................. | 711/128 |
| 7,287,051 | B1 * | 10/2007 | Langhammer ................ | 708/490 |
| 7,567,997 | B2 * | 7/2009 | Simkins et al. .............. | 708/523 |
| 2005/0144215 | A1 * | 6/2005 | Simkins et al. .............. | 708/620 |

OTHER PUBLICATIONS

Altera ("6. DSP Blocks in Stratix & Stratix GX Devices") , Jul. 2005.*
Altera, Stratix III Device Handbook, vol. 1, Nov. 2007, pp. 1-1-1-16, and 5-1-5-50.
Xilinx, Virtex-4 Family Overview, DS112 (v.3.0) Sep. 28, 2007, 9 pages.
Xilinx, Virtex-5, Family Overview, DS100 (v.4.0) Mar. 31, 2008, 13 pages.
Xilinx, Virtex-5 FPGA XtremeDSP Design Considerations User Guide, UG193(v3.0) Mar. 31, 2008, 116 pages.
Xilinx, XtremeDSP for Virtex-4 FPGAs User Guide, UG073 (v.2.6) Oct. 31, 2007, 124 pages.

* cited by examiner

*Primary Examiner* — Chat Do
*Assistant Examiner* — Jae Jeon

(57) ABSTRACT

Various implementations of a digital signal processing (DSP) block architecture of a programmable logic device (PLD) and related methods are provided. In one example, a PLD includes a dedicated DSP block. The DSP block includes a first multiplier adapted to multiply a first plurality of input signals to provide a first plurality of product signals. The DSP block also includes a second multiplier adapted to multiply a second plurality of input signals to provide a second plurality of product signals. The DSP block further includes an arithmetic logic unit (ALU) adapted to operate on the first product signals and the second product signals received at first and second operand inputs, respectively, of the ALU to provide a plurality of output signals.

10 Claims, 7 Drawing Sheets

DIGITAL SIGNAL PROCESSING BLOCK ARCHITECTURE FOR PROGRAMMABLE LOGIC DEVICE

TECHNICAL FIELD

The present invention relates generally to programmable logic devices and, more particularly, to digital signal processing performed by programmable logic devices.

BACKGROUND

Programmable logic devices (PLDs), such as field programmable gate arrays (FPGAs) or complex programmable logic devices (CPLDs), may be used to perform various processing and logic operations in a wide variety of applications. In this regard, PLDs generally include logic blocks which may be configured to provide user-defined features. However, in certain implementations, PLDs may further include one or more digital signal processing (DSP) blocks implemented by dedicated hardware to provide additional processing. Such DSP blocks may be used, for example, to provide fast processing of signals provided by the user-configurable logic blocks or other signals received by the PLD.

However, various existing DSP block designs often fail to provide flexibility in the routing and synchronization of signals between the DSP blocks and other portions of the PLD. For example, when performing operations that depend on the results from multiple DSP blocks, certain existing DSP block designs often exhibit significant latencies due to the time required to latch intermediate results between multiple pipelined DSP blocks.

Certain existing PLDs may be implemented with a finite number of DSP blocks arranged in a plurality of rows, with each row including a plurality of DSP blocks. However, when a desired operation requires the use of more DSP blocks than are available in a given row, such PLDs typically do not provide a convenient way for signals of one row to be routed to another row. Such limitations can unduly complicate the processing performed by PLDs.

Accordingly, there is a need for an improved DSP block implementation that provides improved flexibility over previous DSP block designs. In particular, there is a need for such a DSP block implementation that addresses the concerns associated with existing DSP block designs.

SUMMARY

In accordance with one embodiment of the present invention, a programmable logic device (PLD) includes a dedicated digital signal processing (DSP) block, the DSP block includes a first multiplier adapted to multiply a first plurality of input signals to provide a first plurality of product signals; a second multiplier adapted to multiply a second plurality of input signals to provide a second plurality of product signals; and an arithmetic logic unit (ALU) adapted to operate on the first product signals and the second product signals received at first and second operand inputs, respectively, of the ALU to provide a plurality of output signals.

In accordance with another embodiment of the present invention, a method performed by a dedicated digital signal processing (DSP) block of a programmable logic device (PLD) includes multiplying a first plurality of input signals to provide a first plurality of product signals; multiplying a second plurality of input signals to provide a second plurality of product signals; and processing the first product signals and the second product signals at an arithmetic logic unit (ALU) of the DSP block to provide a plurality of output signals.

In accordance with another embodiment of the present invention, a programmable logic device (PLD) includes a dedicated digital signal processing (DSP) block, the DSP block includes first means for multiplying a first plurality of input signals to provide a first plurality of product signals; second means for multiplying a second plurality of input signals to provide a second plurality of product signals; and means for processing the first product signals and the second product signals to provide a plurality of output signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various embodiments further set forth herein, a DSP block and related methods are provided which may be implemented in a PLD to provide improved flexibility in DSP operations. For example, in one embodiment, a DSP block is provided with two multipliers and a ternary arithmetic logic unit (ALU). Various signals may be cascaded between DSP slices of one or more DSP blocks, and selectively latched by register blocks reduce associated signal latencies.

In another embodiment, an ALU of a DSP block may be implemented to support various types of single instruction multiple data operations. As a result, a large proportion of a wide ALU datapath may be utilized for operations using operands having bit widths substantially smaller than the bit widths of the ALU datapath.

In another embodiment, output signals provided by one or more DSP blocks may be selectively routed to other DSP blocks, such as DSP blocks implemented in different rows, to facilitate the use of multiple DSP block rows for performing DSP-intensive calculations. In another embodiment, a DSP block may be implemented to provide a memory-saving approach to various types of rounding operations performed by the DSP block. In another embodiment, a DSP block may be implemented to support programmable sign extension of various signals processed by the DSP block. Additional embodiments are also disclosed as further set forth herein.

Figure 1:
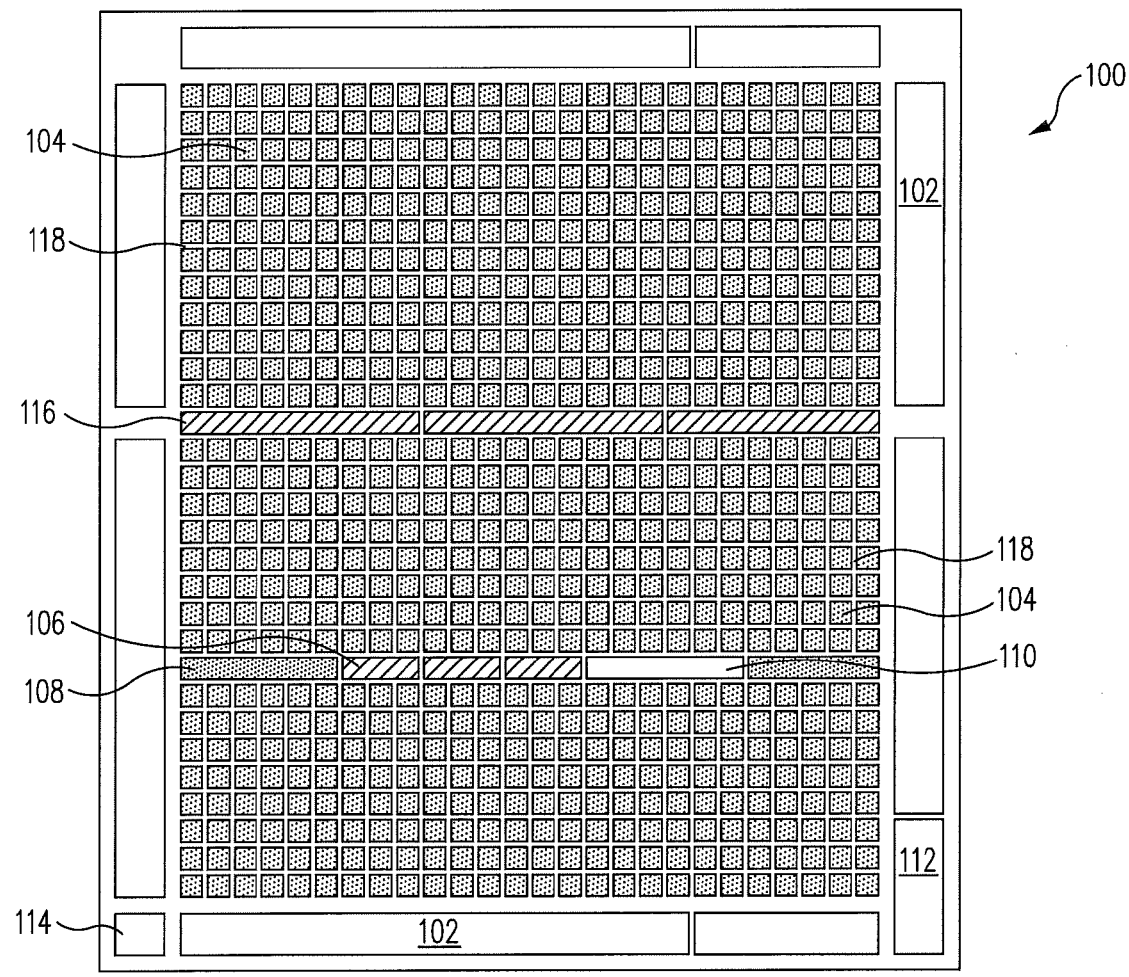
FIG. 1 illustrates a block diagram of a programmable logic device (PLD) in accordance with an embodiment of the invention.

FIG. 1 illustrates a block diagram of a programmable logic device (PLD) 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

Figure 2:
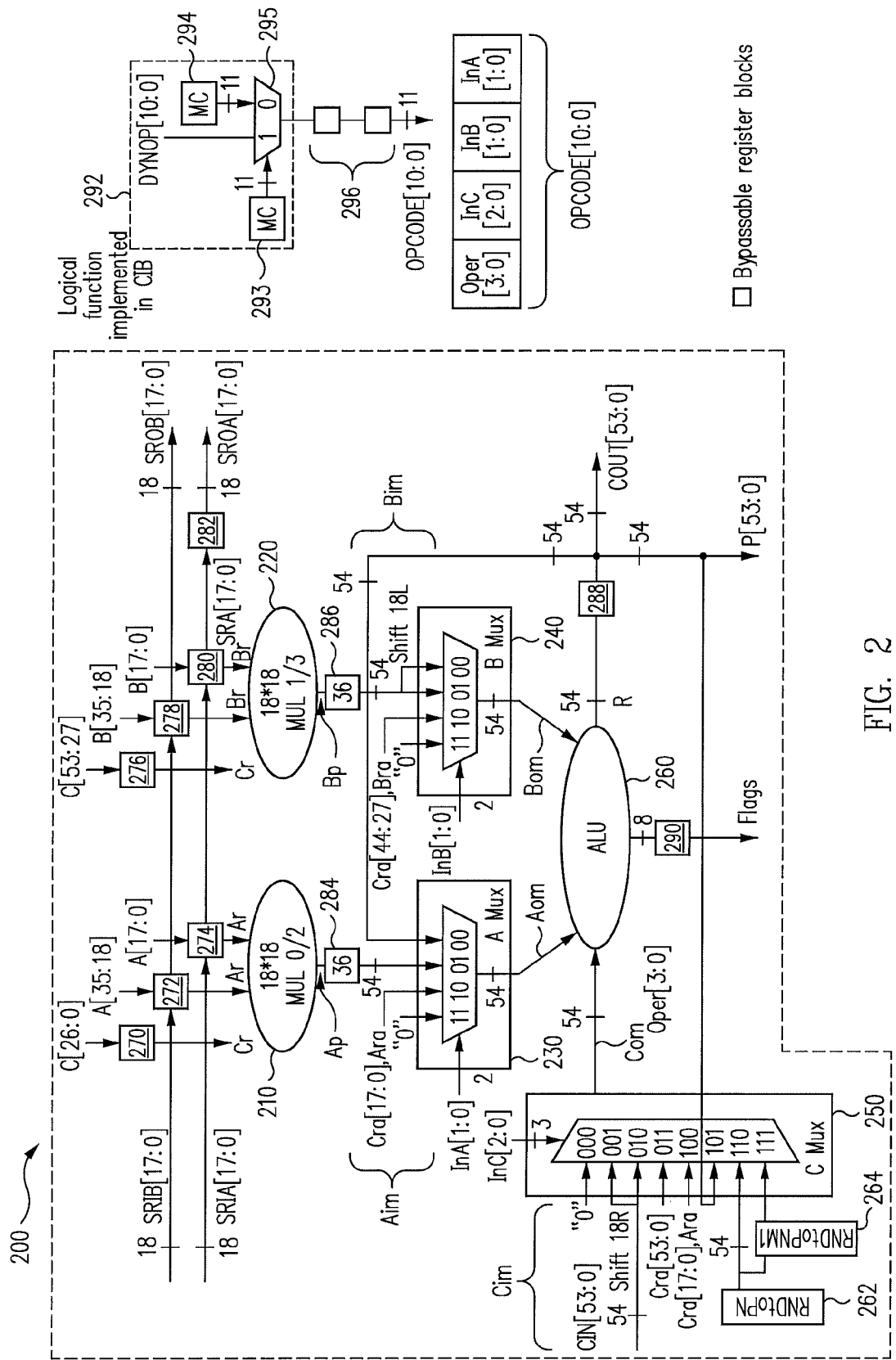
FIG. 2 illustrates a digital signal processing (DSP) block and an instruction control block of a PLD in accordance with an embodiment of the invention.

FIG. 2 illustrates a digital signal processing (DSP) block 200 and an instruction control block 292 of a PLD in accordance with an embodiment of the invention. For example, in one embodiment, DSP block 200 may be implemented as one of special function blocks 116 of PLD 100 using dedicated circuitry. In this regard, DSP block 200 may be one of a plurality of DSP blocks that are arranged in a plurality of rows (for example, 2 to 4 rows) and/or columns (for example, 32 to 40 columns). As shown in FIG. 2, DSP block 200 includes multipliers 210 and 220, multiplexers 230, 240, and 250, and an ALU such as ternary arithmetic logic unit (ALU) 260.

In various embodiments, DSP block 200 includes means such as multiplier 210 for multiplying a first plurality of input signals to provide a first plurality of product signals, and also includes means such as multiplier 220 for multiplying a second plurality of input signals to provide a second plurality of product signals. DSP block 200 includes means such as ALU 260 for processing the first product signals and the second product signals to provide a plurality of output signals. Means such as ALU 260 may also be used to process the output signals when the output signals are received by another one of DSP blocks 200 (e.g., when cascaded between DSP slices as further described herein).

DSP block 200 receives a plurality of input signals A, B, and C as shown in FIG. 2. Input signals A, B, and C may be provided by other portions of PLD 100 such as, for example, I/O blocks 102 and/or logic blocks 104.

DSP block 200 also receives a plurality of input signals SRIA and SRIB as shown in FIG. 2. Input signals SRIA and SRIB may be provided, for example, by other DSP blocks or DSP slices (further described herein) of PLD 100.

DSP block 200 provides a plurality of signals SROA and SROB which may be provided, for example, to other DSP blocks or DSP slices of PLD 100 (e.g., to be received as input signals by other DSP blocks or DSP slices). In this regard, signals SROA and SROB correspond to various input signals A, B, C, SRIA, or SRIB passed by register blocks 270, 272, 274, 276, 278, or 280. Signals SROA additionally pass through a register block 282 which may be used to delay signals SROA with respect to signals COUT. In this regard, means such as register block 282 may be used to delay signals SROA with respect to signals COUT as signals SROA are cascaded from a first DSP slice (e.g., a DSP slice implemented by the components of DSP block 200) to an additional multiplier 210 of a second DSP slice (e.g., another DSP slice implemented by another set of the components of DSP block 200) and as signals COUT are cascaded from the first DSP slice to an ALU 260 of the second DSP slice.

As shown in FIG. 2, input signals A, B, C, SRIA, and SRIB are received by various register blocks 270, 272, 274, 276, 278, and 280 which may selectively latch the received signals or permit the received signals to pass without latching. Signals passed by register blocks 272 and 274 are labeled Ar; signals passed by register blocks 278 and 280 are labeled Br; signals passed by register blocks 270 and 276 are labeled Cr.

In this regard, means such as register blocks 270, 272, 274, 276, 278, 280, and 282 may be used for cascading input signals A, B, C, SRIA, and SRIB of a first DSP slice (e.g., a DSP slice implemented by the components of DSP block 200) to additional multipliers 210 and 220 of a second DSP slice (e.g., another DSP slice implemented by another set of the components of DSP block 200).

Multiplier 210 receives and multiplies signals Ar. Similarly, multiplier 220 receives and multiplies signals Br. Accordingly, multipliers 210 and 220 provide product signals Ap and Bp corresponding to their respective products, which are latched by register blocks 284 and 286.

Multiplexers 230, 240, and 250 receive a plurality of input signals Aim, Bim, and Cim, respectively, provided over 54 bit input signal buses, for example. Some of input signals Cim are provided by a register 262 and rounding logic 264 which may be used for performing rounding operations as will be further described herein.

The following Table 1 identifies the various input signals Aim provided to multiplexer 230:

TABLE 1

| Input Signals Aim to Multiplexer 230 | Description |
| --- | --- |
| 00 | output signals COUT (feedback from ALU 260) |
| 01 | latched value of product signals Ap (output of multiplier 210) sign extended to 54 bits |
| 10 | subsets of signals Ar and Cr sign extended, if necessary, to 54 bits |
| 11 | "0" zero |

The following Table 2 identifies the various input signals Aim provided to multiplexer 240:

TABLE 2

| Input Signals Bim to Multiplexer 240 | Description |
| --- | --- |
| 00 | latched value of product signals Bp (output of multiplier 220) shifted 18 bits to the left |
| 01 | latched value of product signals Bp (output of multiplier 220) sign extended to 54 bits |
| 10 | subsets of signals Br and Cr sign extended, if necessary, to 54 bits |
| 11 | "0" zero |

The following Table 3 identifies the various input signals Aim provided to multiplexer 250:

TABLE 3

| Input Signals Cim to Multiplexer 250 | Description |
| --- | --- |
| 000 | "0" zero |
| 001 | cascading input signals CIN provided by output signals COUT from another DSP block or DSP slice shifted 18 bits to the right |
| 010 | cascading input signals CIN provided by output signals COUT from another DSP block or DSP slice |
| 011 | latched value of input signals C sign extended, if necessary, to 54 bits |
| 100 | subsets of signals Ar and Cr sign extended, if necessary, to 54 bits |
| 101 | output signals COUT (feedback from ALU 260) |
| 110 | constant stored by register 262 used for rounding operations |
| 111 | constant provided by rounding logic 264 used for rounding operations |

As shown in FIG. 2, input signals selected by multiplexers 230, 240, and 250 are provided over three input busses to ALU 260 as output signals Aom, Bom, and Com, respectively. ALU 260 operates on output signals Aom, Bom, and/or Com to provide output signals R and output flags to register blocks 288 and 290, respectively. Register block 288 provides output signals COUT which may be cascaded to a DSP slice as further described herein. Register block 288 also provides output signals P which may be provided to other portions of PLD 100 such as other DSP blocks, DSP slices, output blocks, or routing resources as further described herein. In this regard, means such as register block 288 may be used for cascading output signals P or COUT from ALU 260 of a first DSP slice (e.g., a DSP slice implemented by the components of DSP block 200) to another ALU 260 of a second DSP slice (e.g., another DSP slice implemented by another set of the components of DSP block 200).

The particular input signals Aim, Bim, and Cim selected by multiplexers 230, 240, and 250, and the operations performed by ALU 260 on the selected signals may determined by one or more instructions. For example, in one embodiment, such instructions may be formatted in accordance with an opcode provided by instruction control block 292. In one embodiment, instruction control block 292 may be implemented as part of a common interface block of PLD 100. In PLDs implemented with multiple DSP blocks 200, a corresponding instruction control block 292 may provided for each DSP block 200 to permit the DSP blocks 200 to perform different operations from each other.

As shown in FIG. 2, instruction control block 292 may be used to provide an opcode for controlling DSP block 200. In this regard, memory cells 293 may be programmed to cause a multiplexer 295 to select between a dynamically generated opcode DYNOP or an opcode stored by memory cells 294. The selected opcode passed by multiplexer 295 is latched by register blocks 296.

In one embodiment, the selected opcode may include various fields as illustrated in FIG. 2. In this regard, an operation field (labeled "Oper") identifies the arithmetic and/or logical operation to be performed by ALU 260, and multiplexer input fields (labeled "InA," "InB," and "InC") select particular input signals Aim, Bim, and Cim passed by multiplexers 230, 240, and 250 as output signals Aom, Bom, and Com, respectively. The following Table 4 identifies various operations of ALU 260 associated with different decimal values represented by the operation field in accordance with one embodiment:

TABLE 4

Add/Sub and ALU Operations

| OPERATION | OPR3 | OPR2 | OPR1 | OPR0 | FUNCTION |
|---|---|---|---|---|---|
| 1 | 0 | 1 | 0 | 0 | R = Aom + Bom + Com |
| 2 | 0 | 1 | 0 | 1 | R = Aom − Bom + Com |
| 3 | 0 | 1 | 1 | 0 | R = Aom + Bom − Com |
| 4 | 0 | 1 | 1 | 1 | R = Aom − Bom − Com |
| 5 | 1 | 1 | 0 | 0 | R = Bom XNOR Com |
| 6 | 1 | 1 | 1 | 0 | R = Bom XOR Com |
| 7 | 0 | 0 | 0 | 0 | R = Bom NAND Com |
| 8 | 1 | 0 | 0 | 0 | R = Bom AND Com |
| 9 | 0 | 0 | 1 | 1 | R = Bom OR Com |
| 10 | 1 | 0 | 1 | 1 | R = Bom NOR Com |
| 11 | 0 | 0 | 0 | 1 | R = ! Bom NAND Com / R = Bom OR ! Com |
| 12 | 1 | 0 | 0 | 1 | R = ! Bom AND Com / R = Bom NOR !Com |
| 13 | 1 | 0 | 1 | 0 | R = ! Bom NOR Com / R = Bom AND !Com |
| 14 | 0 | 0 | 1 | 0 | R = ! Bom OR Com / R = Bom NAND !Com |

In the embodiment identified in Table 4, all other values of the operation field that are not shown in Table 4 are ignored by DSP block 200.

Figure 3:
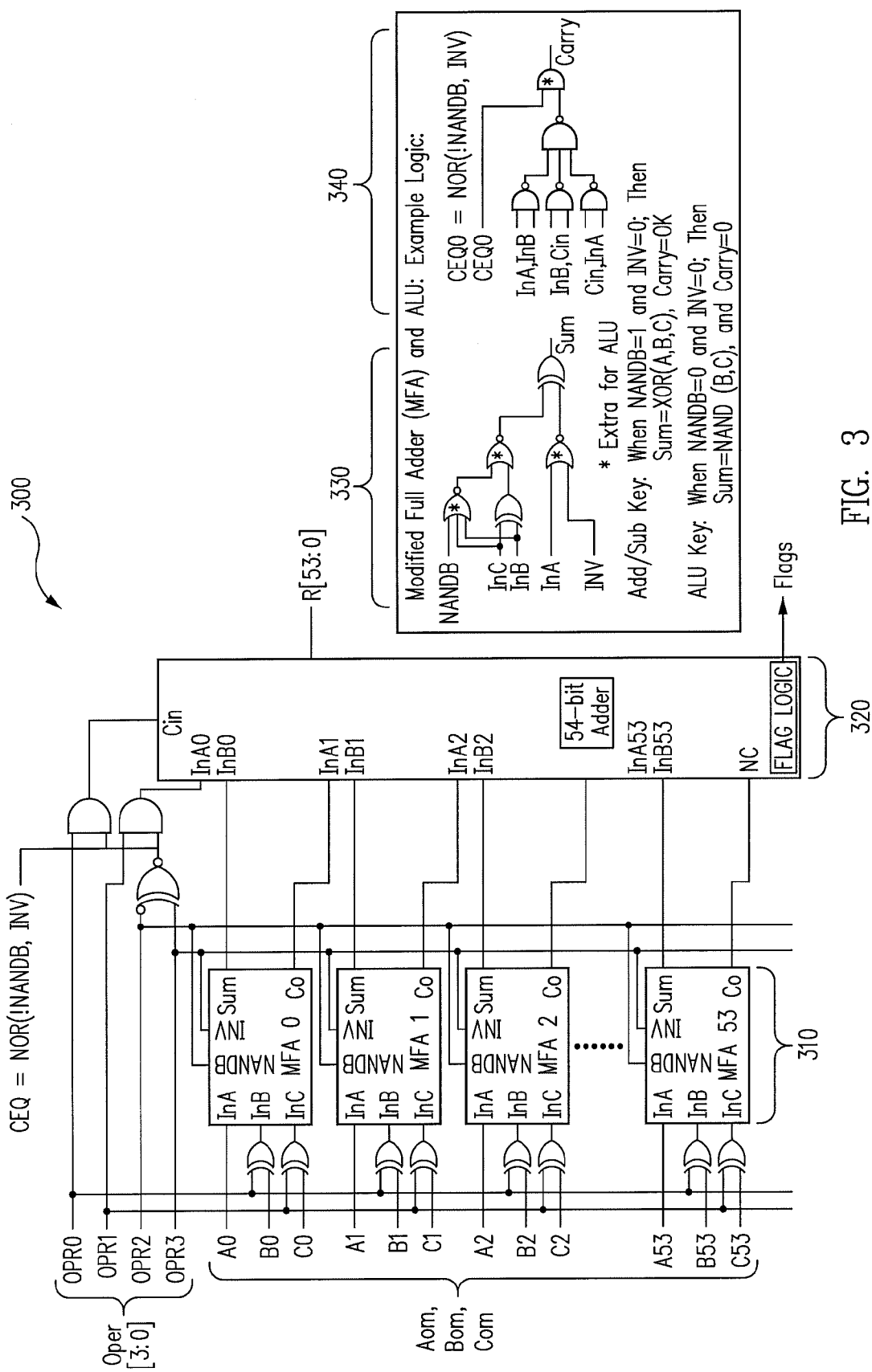
FIG. 3 illustrates an arithmetic logic unit (ALU) of a DSP block of a PLD in accordance with an embodiment of the invention.

FIG. 3 illustrates an ALU 300 of a DSP block of a PLD in accordance with an embodiment of the invention. For example, in one embodiment, ALU 300 may be used to implement ALU 260 of DSP block 200. ALU 300 includes a plurality of modified full adders 310 which receive output signals Aom, Bom, and Com from multiplexers 230, 240, and 250. In one embodiment, each of modified full adders 310 may be implemented by logic 330 and 340 shown in FIG. 3. ALU 300 also includes an adder 320 which operates on sum and carry output signals from modified full adders 310 to provide output signals R.

In one embodiment, ALU 260 of DSP block 200 supports single instruction multiple data (SIMD) operations. In this regard, it will be appreciated that each of output signals Aom, Bom, and Com provided to ALU 260 are 54 bits wide and are therefore capable of providing 54 bit operands to ALU 260. However, in certain examples, the actual number of bits used by such operands may be significantly less than the entire 54 bits available. For example, in some implementations, typical operands may range from about 8 bits to 24 bits. Advantageously, the wide 54 bit data path provided by ALU 260 permits multiple operands to be provided by a single set of output Aom, Bom, and/or Com for simultaneous processing by ALU 260.

Figure 4:
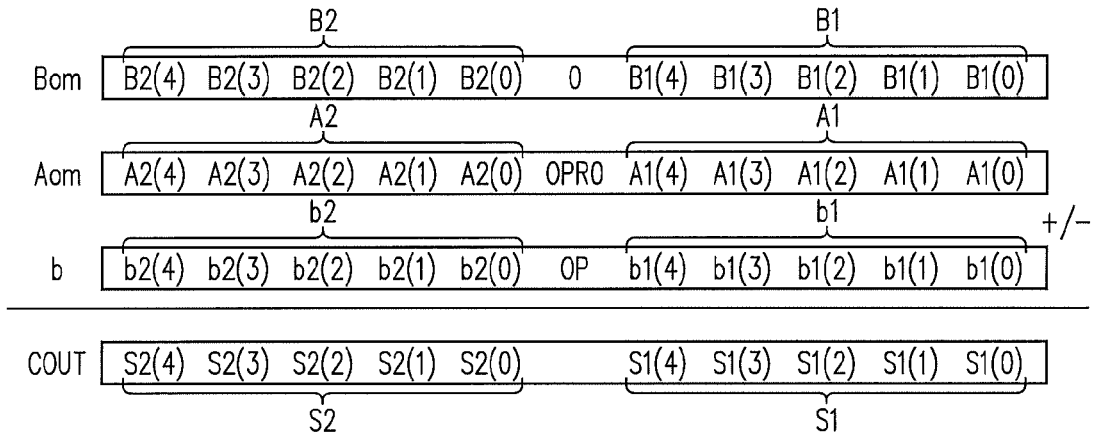
FIG. 4 illustrates a single instruction multiple data operation performed by an ALU of a DSP block of a PLD in accordance with an embodiment of the invention.

For example, FIG. 4 illustrates an SIMD operation performed using output signals Aom and Bom provided to ALU 260. In the example shown in FIG. 4, only the least significant 11 bits of output signals Aom and Bom are illustrated. However, it will be appreciated that any desired number of bits may be used where appropriate.

In FIG. 4, output signals Aom include an operand A1 (e.g., A1(0) through A1(4)), an operand A2 (e.g., A2(0) through A2(4)), and a separation bit OPR0. Output signals Bom include an operand B1 (e.g., B1(0) through B1(4)), an operand B2 (e.g., B2(0) through B2(4)), and a separation bit 0.

FIG. 4 further illustrates intermediate signals b which include an operand b1 (e.g., b1(0) through b1(4)), an operand b2 (e.g., b2(0) through b2(4)), and a separation bit OP. Intermediate signals b may be prepared by ALU 260 from output signals Bom. In this regard, if separation bit OPR0=0, then operands b1 and b2 of intermediate signals b will correspond to operands B1 and B2, respectively, of output signals Bom. If separation bit OPR0=1, then operands b1 and b2 of intermediate signals b will correspond to inverted values of operands B1 and B2, respectively. In either case, separation bit OP of intermediate signals b may be determined as follows: OP=XOR(0, OPR0).

FIG. 4 also illustrates output signals COUT (e.g., result signals) which include a result S1 (e.g., S1(0) through S1(4)) and a result S2 (e.g., S2(0) through S2(4)). ALU 260 may be configured to process operands A1 and B1 to provide result S1, and simultaneously process operands A2 and B2 to provide result S2. The particular operation performed in this embodiment may be identified by separation bit OPR0 of output signals Aom.

For example, in one embodiment, if separation bit OPR0=0, then S1=A1+B1 and S2=A2+B2. In this case, ALU 260 adds operand A1 to operand b1 (which in this case corresponds to operand B1) to provide result S1. ALU 260 also adds operand A2 to operand b2 (which in this case corresponds to operand B2) to provide result S2.

In another example, if separation bit OPR0=1, then S1=A1−B1 and S2=A2−B2. In this case, ALU 260 adds operand A1 to operand b1 (which in this case corresponds to inverted values of operand B1), and also adds a value of one to the sum of operands A1 and b1 (e.g., to complete a two's complement subtraction of operand B1 from operand A1) to provide result S1. ALU 260 also adds operand A2 to operand b2 (which in this case corresponds to inverted values of operand B2) to provide result S2. The carry bit provided by the sum of separation bits OPR0 and OP (e.g., both are set to 1 during subtraction) adds a value of one to the sum of operands A2 and b2 to complete a two's complement subtraction of operand B2 from operand A2.

It will be appreciated that by using various separation bits in output signals Aom and Bom, and also in intermediate signals b, any carry bits resulting from operations performed on operands A1 and b1 will not affect operations performed on operands A2 and b2. In one embodiment, the separation bits may be inserted by other portions of PLD 100 (e.g., I/O blocks 102, logic blocks 104, and/or other DSP blocks of PLD 100) which provide input signals A, B, C, SRIA, and SRIB that may be passed through DSP block 200 in various forms (e.g., as sign extended signals, product signals, or other signals) and received by ALU 260 as output signals Aom and Bom.

It will also be appreciated that additional operands with corresponding separation bits may be provided in output signals Aom and Bom to support additional simultaneous operations where appropriate (e.g., to permit simultaneous operations on three or more operands provided by each of output signals Aom and Bom). As a result, by using the SIMD techniques described herein, a large proportion of the wide data path of ALU 260 may be utilized for simultaneous processing of plurality of operands having bit widths smaller than that of ALU 260.

Figure 5:
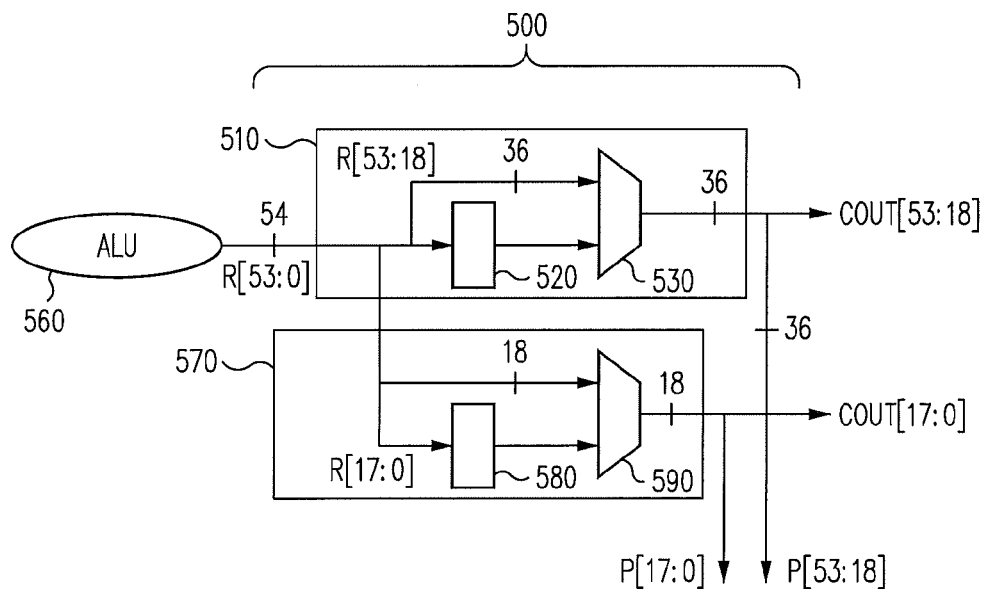
FIG. 5 illustrates a register block of a DSP block of a PLD in accordance with an embodiment of the invention.

FIG. 5 illustrates a bypassable register block 500 of a DSP block of a PLD in accordance with an embodiment of the invention. For example, in the embodiment illustrated in FIG. 5, bypassable register block 500 is used to implement register block 288 of DSP block 200. However, in other embodiments, bypassable register block 500 may be used to implement any register block of DSP block 200.

As shown in FIG. 5, bypassable register block 500 includes an MSB output bank 510 with register 520 and multiplexer 530, and an LSB output bank 570 with register 580 and multiplexer 590. MSB output bank 510 receives output signals R (e.g., provided in this embodiment over a 54 bit bus) from an ALU 560 (e.g., which may be implemented by ALU 260 of PLD block 200). The most significant bits of output signals R (e.g., bits 18 through 53) are provided to register 520 and multiplexer 530. The remaining least significant bits of output signals R (e.g., bits 0 through 17) are provided to LSB output bank 570 where they are received by register 580 and multiplexer 590.

Appropriate control signals may be independently provided to multiplexers 530 and 590 to select between current values of output signals R and previously latched values of output signals R stored by registers 520 and 580. The values selected by multiplexers 530 and 590 are passed as output signals COUT and output signals P as shown in FIG. 5. Advantageously, this configuration allows the most significant bits and the least significant bits of output signals R to be independently passed by register block 500 during the same clock cycle they are received by register block 500 or during a subsequent clock cycle following storage of the output signal values by registers 520 and/or 580.

For example, in one embodiment, passing output signals R through as output signals COUT and output signals P before they are latched by registers 520 and 580 permits the values of output signals R to be provided into other pipelined DSP blocks or other portions of PLD 100 expecting such values without exhibiting undesired latencies. Accordingly, it will be appreciated that means such as register block 288 (e.g., implemented by register block 500) may be used for selectively latching a first subset of output signals R independently of a second subset of output signals R. Such implementations can be used, for example, when implementing pipelined operations implemented over a plurality of DSP blocks such as, for example, 36 bit multiplication operations, 32-bit barrel shifting operations, and other operations where appropriate.

Figure 6:
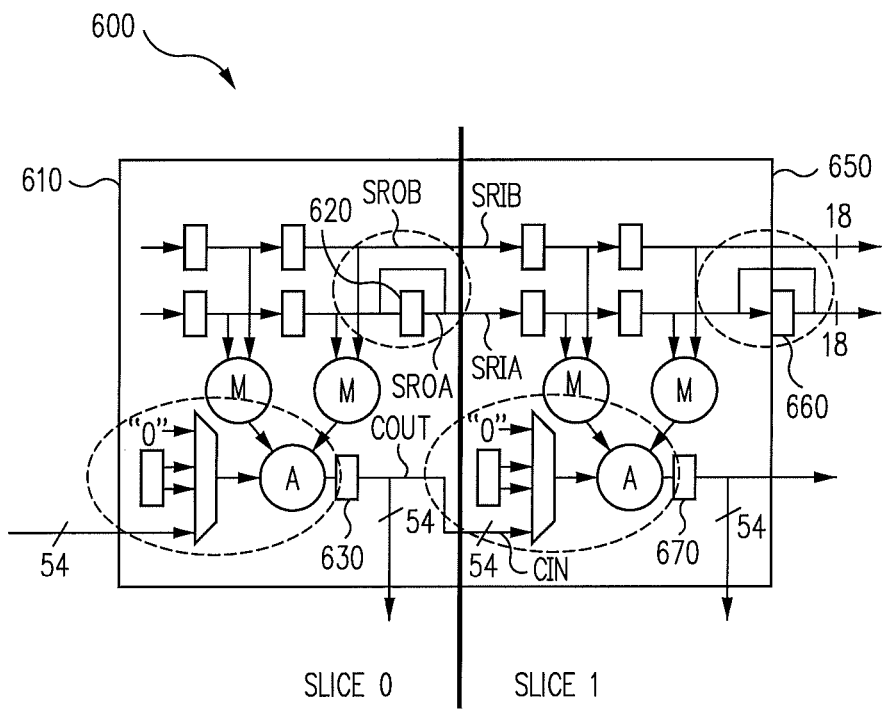
FIG. 6 illustrates cascaded DSP slices of a PLD in accordance with an embodiment of the invention.

In another aspect of the present disclosure, a DSP block comprises multiple DSP slices that may be cascaded together. For example, FIG. 6 illustrates adjacent cascaded DSP slices 610 and 650 of a DSP block 600 in accordance with an embodiment of the invention. In one embodiment, DSP slice 610 may be implemented by the components of DSP block 200 of FIG. 2, and DSP slice 650 may be implemented by another set of the components of DSP block 200 of FIG. 2. In this regard, separate instruction control blocks 292 may be provided for each of DSP slices 610 and 650.

In the embodiment illustrated in FIG. 6, DSP slices 610 and 650 are cascaded together and combined in a single DSP block 600. However, in another embodiment, one or more additional DSP slices may be cascaded together with DSP slices 610 and 650 to provide a row of DSP slices within DSP block 600.

As shown in FIG. 6, DSP slices 610 and 650 are adjacent DSP slices arranged in a row within DSP block 600. In this regard, output signals COUT of DSP slice 610 are provided to DSP slice 650 where they are received as input signals CIN. Similarly, output signals SROA and SROB of DSP slice 610 are provided to DSP slice 650 where they are received as input signals SRIA and SRIB, respectively.

DSP slices 610 and 650 include register blocks 620 and 660, each of which may be implemented by an appropriate register block 282 of FIG. 2. Similarly, DSP slices 610 and 650 include register blocks 630 and 670, each of which may be implemented by an appropriate register block 288 of FIG. 2. In this regard, it will be appreciated that output signals SROA of DSP slice 610 may be selectively latched by register block 620 or, as shown in FIG. 6, may bypass register block 620 to be provided directly to DSP slice 650 (e.g., corresponding to signals SRA illustrated in FIG. 2).

Similarly, output signals COUT of DSP slice 610 may be selectively latched by register block 630 as shown in FIG. 6 or, as not shown in FIG. 6, may bypass register block 630 to be provided directly to DSP slice 650 (e.g., corresponding to output signals R illustrated in FIG. 2).

Figure 7:
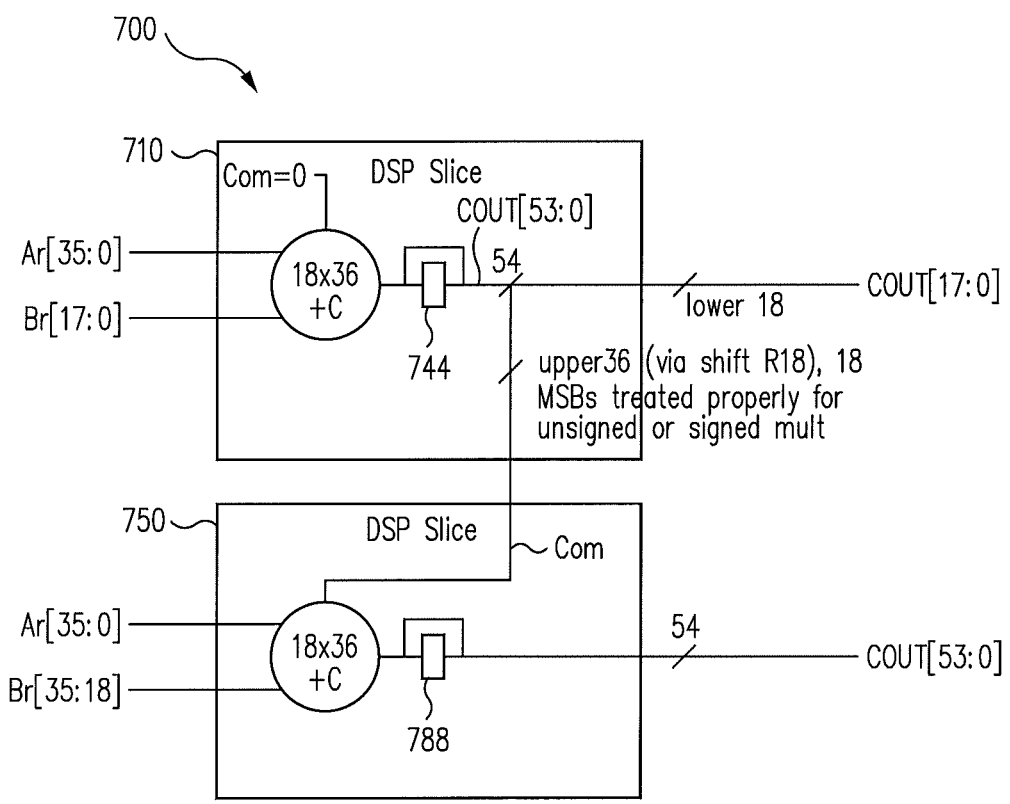
FIG. 7 illustrates a multiplier implemented by cascaded DSP slices of a PLD in accordance with an embodiment of the invention.

In another aspect of the present disclosure, the cascading of signals between DSP slices of a PLD, as well as the bypassable register blocks described above may be used to facilitate DSP operations carried out using multiple DSP slices. For example, FIG. 7 illustrates a 36×36 bit multiplier implemented by cascaded DSP slices 710 and 750 of a PLD in accordance with an embodiment of the invention. In one embodiment, DSP slice 710 may be implemented by the components of DSP block 200 of FIG. 2, and DSP slice 750 may be implemented by another set of the components of DSP block 200 of FIG. 2. In this regard, it will be appreciated that DSP slices 710 and 750 may be implemented with multipliers 210 and 220, multiplexers 230, 240, and 250, ALU 260, and other components of DSP block 200 of FIG. 2.

In the embodiment illustrated in FIG. 7, DSP slices 710 and 750 are cascaded together and combined in a single DSP block 700. However, in another embodiment, one or more additional DSP slices may be cascaded together with DSP slices 710 and 750 to provide a row of DSP slices within DSP block 700.

Together, DSP slices 710 and 750 may be used to multiply input signals Ar and Br which may be provided in the manner previously described in relation to FIG. 2. As shown in FIG. 7, DSP slice 710 is configured to provide an 18×36 bit multiplier (e.g., by using both multipliers 210 and 220 of DSP block 200). Accordingly, DSP slice 710 multiplies all 36 bits of input signals Ar and the 18 least significant bits of input signals Br. As also shown, the product of input signals Ar and Br is added to output signals Com provided to DSP slice 710 (e.g., implemented by 0 in this embodiment).

The most significant 36 bits of the 54 bit output signals COUT provided by DSP slice 710 are cascaded into DSP slice 750 (e.g., provided as the "Shift 18 R" input to a corresponding multiplexer 250 of FIG. 2 implemented in DSP block 710). In DSP slice 750, all 36 bits of input signals Ar and the 18 most significant bits of input signals Br are multiplied and the product is added to cascaded output signals Com received by DSP slice 750 from DSP slice 710 to provide output signals COUT from DSP slice 750.

Advantageously, register blocks 744 and 788 of DSP slices 710 and 750 (e.g., implemented by a corresponding register block 288 of FIG. 2) may be bypassed in the manner identified in FIGS. 5 and 6 to provide corresponding output signals COUT from each of DSP slices 710 and 750 without incurring undesired latencies. As a result, output signals COUT [17:0] and output signals COUT [53:0] collectively provide a 72 bit product resulting from the multiplication of input signals Ar and Br.

Figure 8:
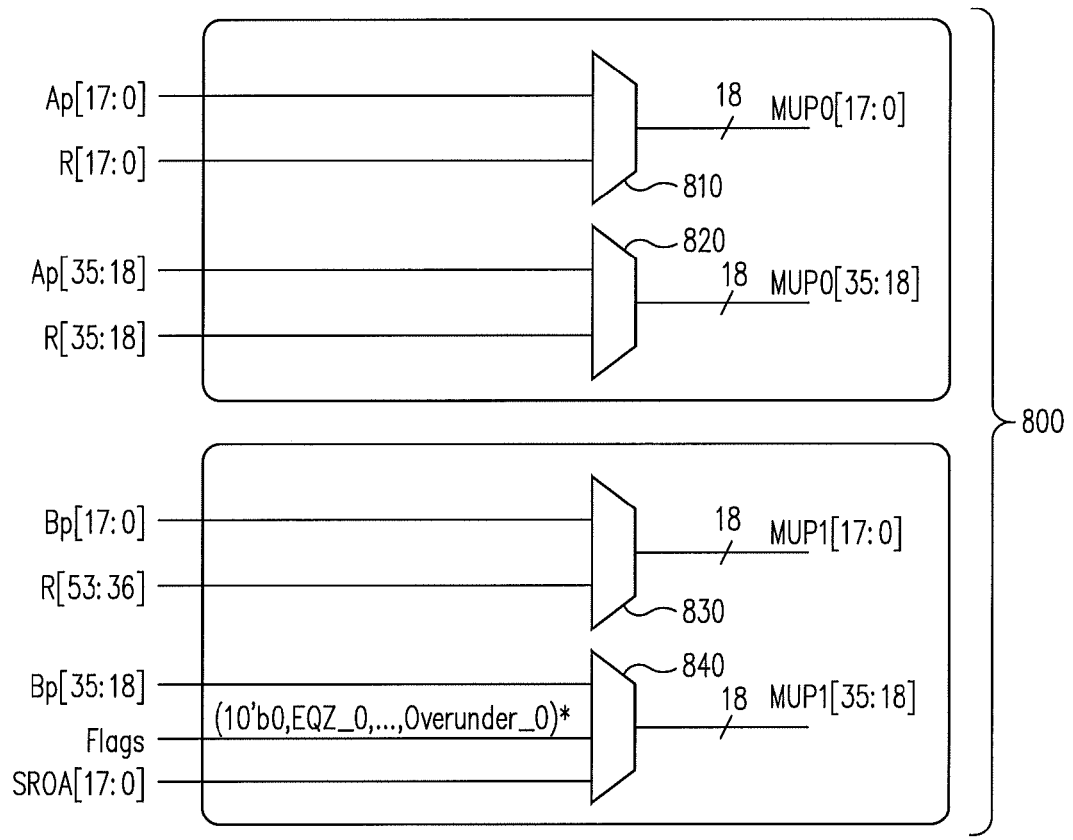
FIG. 8 illustrates multiplexers of a DSP block of a PLD in accordance with an embodiment of the invention.

In another aspect of the present disclosure, various signals of a DSP block of a PLD may be flexibly routed to other DSP blocks and/or other portions of a PLD. For example, FIG. 8 illustrates multiplexers 810, 820, 830, and 840 of an output block 800 of a DSP block in accordance with an embodiment of the invention. In one embodiment, multiplexers 810, 820, 830, and 840 may be implemented as part of DSP block 200 of FIG. 2 (multiplexers 810, 820, 830, and 840 are not shown in FIG. 2).

Multiplexers 810, 820, 830, and 840 receive various signals illustrated in FIG. 2. For example, multiplexers 810 and 820 receive various subsets of product signals Ap and of output signals R. Multiplexer 830 receives subsets of product signals Bp and of output signals R. Multiplexer 840 receives a subset of product signals Bp, output flags, and signals SROA.

Multiplexers 810, 820, 830, and 840 selectively provide these various received signals as output signals MUP0 and MUP1 as shown in FIG. 8. Advantageously, output signals MUP0 and MUP1 may be provided to other portions of PLD 100 if desired. As a result, output signals MUP0 and MUP1 may be selectively routed through other portions of PLD 100 (for example, through routing resources 118) to one or more additional DSP blocks, such as another row of DSP blocks. Multiplexers 810, 820, 830, and 840 permit various signals of DSP block 200 (for example, product signals Ap and Bp, output signals R, signals SROA, and/or output flags) to be flexibly routed to other DSP blocks and/or other portions of PLD 100. For example, in one embodiment, such signals may be routed through routing resources 118 of PLD 100 and provided as input signals A, B, and/or C of another row of one or more DSP blocks. Accordingly, it will be appreciated that means such as output block 800, multiplexers 810, 820, 830, and 840, and routing resources 118 may be used for selectively passing input signals A, B, C, Aim, Bim, Cim, SRIA, and SRIB, product signals Ap and Bp, and output signals COUT from a first DSP block (e.g., DSP block 200) to a second DSP block (e.g., another one of DSP blocks 200).

In another aspect of the present disclosure, a DSP block may be implemented to provide a memory-saving approach to the rounding of data values. In this regard, various types of rounding operations may be performed by adding a constant value to an initial data value in binary form, and then truncating the result. For example, in one embodiment, a constant of the form 0 . . . 010 . . . 0 may be used when rounding a positive number toward infinity or rounding a negative number (in two's complement form) toward zero, where the position of 1 in the constant is located at one bit to the right of the rounding (binary) point. Rounding operations using this first constant are referred to as rounding up operations.

In another embodiment, a constant of the form 0 . . . 001 . . . 1 may be used when rounding a negative number (in two's complement form) toward negative infinity or rounding a positive number toward zero, where the leftmost value of 1 in the constant is located at two bits to the right of the rounding point. Rounding operations using this second constant are referred to as rounding down operations.

The following Table 5 identifies two examples of these constants which may be used in several rounding operations for 40 bit data values, where N is 24:

TABLE 5

| Rounding Operation | Constant |
| --- | --- |
| Rounding up | 00000000 00000000 10000000 00000000 00000000 |
| Rounding down | 00000000 00000000 01111111 11111111 11111111 |

Figure 9:
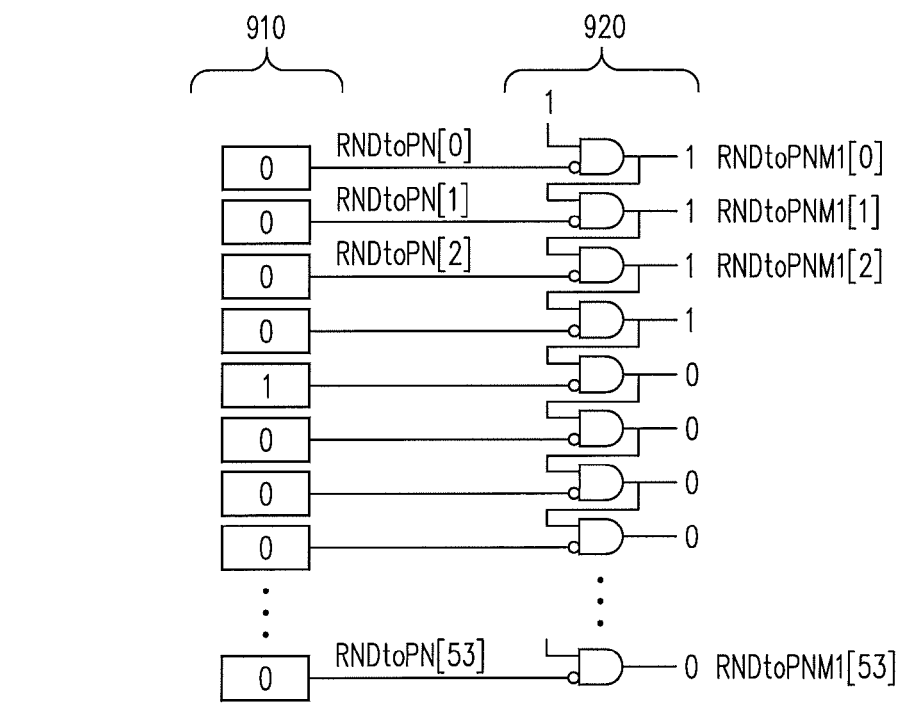
FIG. 9 illustrates a register block and logic that may be used as part of a rounding operation performed by a DSP block of a PLD in accordance with an embodiment of the invention.

The constant used for rounding down operations may be obtained by performing logic operations on the constant used for rounding up operations. For example, FIG. 9 illustrates a block diagram of a register 910 and rounding logic 920 that may be used as part of a rounding operation performed by a DSP block of a PLD in accordance with an embodiment of the invention. In one embodiment, register 910 and rounding logic 920 may be used to implement register 262 and rounding logic 264, respectively, of DSP block 200.

As shown in FIG. 9, register 910 holds a first 54-bit constant which may be used to perform rounding up operations (where the rounding point in this example is between the fifth and sixth bit positions): 0 . . . 00010000. In one embodiment, the constant may be provided to register 910 by static fuses set by the particular configuration of PLD 100.

The first constant held by register 910 is provided to rounding logic 920 through rounding constant signals RNDtoPN[0] to RNDtoPN[53]. Rounding logic 920 operates on the corresponding bit values of the rounding constant signals to provide a second 54 bit constant through rounding constant signals RNDtoPNM1[0] to RNDtoPNM1[53]. The second rounding constant may be used to perform rounding down operations (where the rounding point again is between the fifth and sixth bit positions): 0 . . . 00001111.

Advantageously, by providing the second constant using rounding logic 920, no register of PLD 100 is required to hold the value of the second constant. Rather, two different rounding constants may be provided to multiplexer 250 of DSP block 200 (e.g., by register 262 implemented by register 910, and by rounding logic 264 implemented by rounding logic 920). Such an implementation is particularly useful in embodiments where rounding logic 920 consumes less physical area and is less costly to implement than an additional register. It will be appreciated that the techniques described above may be similarly applied to other types of rounding operations (e.g., convergent rounding operations) where appropriate.

Figure 10:
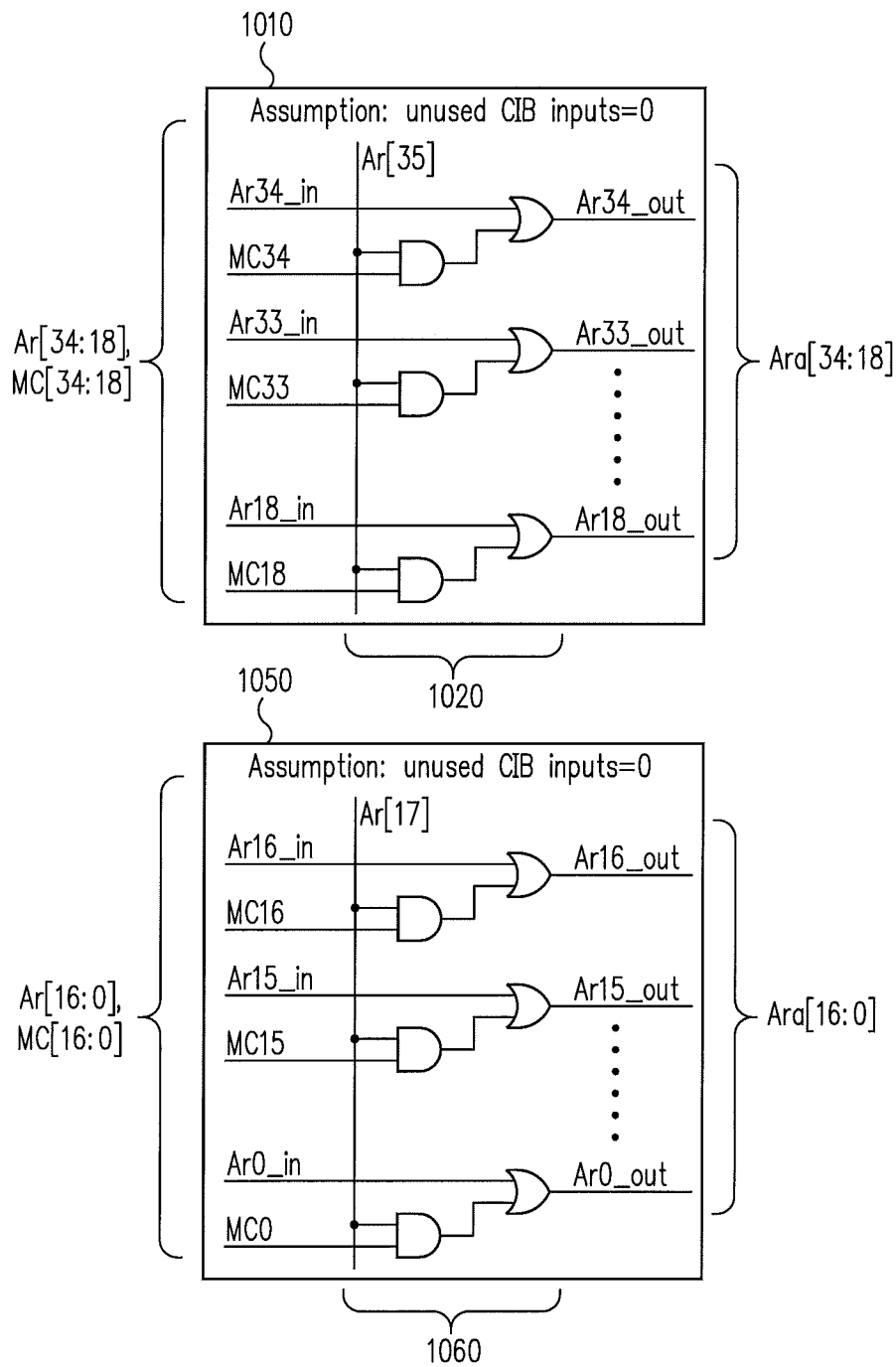
FIG. 10 illustrates programmable sign extension (PSE) blocks of a DSP block of a PLD in accordance with an embodiment of the invention.

In another aspect of the present disclosure, a DSP block of a PLD may be implemented to provide programmable sign extension of data values provided by signals of the PLD. For example, FIG. 10 illustrates programmable sign extension (PSE) blocks 1010 and 1050 of a DSP block in accordance with an embodiment of the invention. In one embodiment, PSE blocks 1010 and 1050 may be implemented as part of DSP block 200 of FIG. 2 (PSE blocks 1010 and 1050 are not shown in FIG. 2).

As shown in FIG. 10, PSE blocks 1010 and 1050 receive various subsets of signals Ar previously described in FIG. 2, and also receive various subsets of programmable signals MC from other portions of PLD 100 (for example, from logic blocks 104 or a register of PLD 100). PSE blocks 1010 and 1050 include logic 1020 and 1060, respectively which operates on signals Ar (e.g., which may include a sign bit and an operand associated with the sign bit) and programmable signals MC to provide sign extended signals Ara. In this regard, sign extended signals Ara may be provided as part of input signals Aim and Cim to multiplexers 230 and 250, respectively, of DSP block 200 as shown in FIG. 2.

Upon inspection of PSE block 1010, it will be appreciated that the values of sign extended signals Ara[34:18] will correspond to those of signals Ar[34:18] unless corresponding programmable signals MC[34:18] are set to a logic high value and the most significant bit of signals Ar provided to PSE block 1010 (e.g., signal Ar[35] corresponding to a sign bit) is also set to a logic high value, in which case corresponding sign extended signals Ara[34:18] will also be set to logic high values.

Accordingly, it will be appreciated that any desired combination of sign extended signals Ara[34:18] may be provided with logic high values (for example, to sign extend a negative number provided by signals Ar in two's complement form) based on the values of signal Ar[35] and programmable signals MC[34:18].

Advantageously, such sign extension may be provided by fanning out only one of signals Ar (e.g., signal Ar[35]) over multiple signal paths to logic 1020, while the remaining signals Ar provided to PSE block 1010 (e.g., signals Ar[34:18]) need not fan out over multiple signal paths to logic 1020. As a result, the routing of signals Ar can be simplified in PLD 100 while also providing flexibility in the particular sign extended bits available from sign extended signals Ara[34:18].

It will be appreciated that the values of sign extended signals Ara[16:0] can be similarly determined based on the operation of logic 1060, programmable signals MC[16:0], and signal Ar[17]. As such, it will be further appreciated that by using PSE blocks 1010 and 1050 in combination with each other, a tiered approach to sign extension may be realized with PSE block 1010 used to sign extend the most significant bits of signals Ar, and PSE block 1050 used to sign extend the least significant bits of signals Ar.

Signals Br and Cr previously described in FIG. 2, may be similarly sign extended using appropriate PSE blocks and programmable signals in a similar manner as described above. For example, in one embodiment, signals Br may be sign extended using signals Br[17] and Br[35] fanning out to appropriate logic to provide sign extended signals Bra that are provided as part of input signals Bim to multiplexer 240 of DSP block 200 as shown in FIG. 2. In another embodiment, signals Cr may be sign extended using signals Cr[17], Cr[44], and Cr[53] fanning out to appropriate logic to provide sign extended signals Cra that are provided as part of input signals Aim, Bim, and Cim to multiplexers 230, 240, and 250, respectively, of DSP block 200 as shown in FIG. 2.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) including a digital signal processing (DSP) block, the DSP block comprising:
    a first DSP slice including:
        a first multiplier adapted to multiply a plurality of input signals to provide first product signals;
        a second multiplier adapted to multiply a plurality of input signals to provide second product signals; and
        a first arithmetic logic unit (ALU) adapted to operate on the first product signals and the second product signals received at first second operand inputs, respectively, of the ALU to provide first output signals; and
    a second DSP slice including:
        a third multiplier adapted to multiply a plurality of input signals to provide third product signals;
        a fourth multiplier adapted to multiply a plurality of input signals to provide fourth product signals; and
        a second arithmetic logic unit (ALU) having at least three operand inputs and adapted to operate on the third product signals, the fourth product signals, and other signals received at the first, second, and third operand inputs, respectively, to provide second output signals,
    wherein the DSP block is adapted to cascade the input signals of the first multiplier to the third and/or fourth multiplier and the input signals of the second multiplier to the third and/or fourth multiplier, and to cascade the first output signals of the first ALU to the third operand input of the second ALU,
    wherein the first output signals and the second output signals collectively provide a product resulting from the multiplication of the pluralities of input signals; and
    wherein:
        the product has 2n bits;
        the first and third pluralities of input signals are a first n-bit signal;
        the second plurality of input signals is the n/2 least significant bits of a second n-bit signal;
        the fourth plurality of input signals is the n/2 most significant bits of a second n-bit signal;
        the n most significant bits of the first output signals are cascaded to the second ALU and the n/2 least significant bits of the first output signals are the n/2 least significant bits of the product; and
        the second output signals are the 3n/2 most significant bits of the product.

2. The PLD of claim 1, the DSP block further comprising a register block in the second slice adapted to selectively latch a first subset of the second output signals independently of a second subset of the second output signals.

3. The PLD of claim 2, the register block comprising:
    a first register adapted to latch the first subset of the second output signals to provide a first set of latched signals;
    a second register adapted to latch the second subset of the second output signals to provide a second set of latched signals;
    a first multiplexer adapted to selectively pass the first subset of the second output signals or the first set of latched signals from the register block; and
    a second multiplexer adapted to selectively pass the second subset of the second output signals or the second set of latched signals from the register block.

4. The PLD of claim 1, wherein:
    the first DSP slice further comprising a register block adapted to delay the cascaded input signals with respect to the cascaded first output signals.

5. The PLD of claim 1, wherein the DSP block is a first DSP block, the PLD further comprising:
    a second DSP block; and
    a plurality of routing resources adapted to pass signals between the first and second DSP blocks, wherein the first DSP block further comprises an output block adapted to selectively pass input signals, product signals, and output signals to the routing resources.

6. The PLD of claim 1 wherein the first and second multipliers are 18×18 bit multipliers.

7. The PLD of claim 1, wherein the second ALU comprises a 54 bit data path.

8. The PLD of claim 1, wherein the second DSP slice includes a multiplexer having an output coupled to the third operand input of the second ALU and having an input adapted to receive the first output signals of the first ALU.

9. A method performed by a digital signal processing (DSP) block of a programmable logic device (PLD), the method comprising:
    in a first DSP slice:
        multiplying a first plurality of input signals to provide first product signals;
        multiplying a second plurality of input signals to provide second product signals; and
        processing the first product signals and the second product signals at a first arithmetic logic unit (ALU) to provide first output signals; and
    in a second DSP slice:
        multiplying a third plurality of input signals to provide third product signals;
        multiplying a fourth plurality of input signals to provide fourth product signals; and
        processing the first output signals of the first ALU, third product signals, and the fourth product signals at a second ALU to provide second output signals, wherein the first output signals of the first ALU are cascaded to the second ALU, wherein the first output signals and the second output signals collectively provide a product resulting from the multiplication of the pluralities of input signals; and wherein:
- the product has 2n bits;
- the first and third pluralities of input signals are a first n-bit signal;
- the second plurality of input signals is the n/2 least significant bits of a second n-bit signal;
- the fourth plurality of input signals is the n/2 most significant bits of a second n-bit signal;
- the n most significant bits of the first output signals are cascaded to the second ALU and the n/2 least significant bits of the first output signals are the n/2 least significant bits of the product; and
- the second output signals are the 3n/2 most significant bits of the product.

10. The method of claim 9, further comprising selectively latching a first subset of the second output signals independently of a second subset of the second output signals.

* * * * *